(12) United States Patent
Gomez et al.

(10) Patent No.: US 10,772,186 B2
(45) Date of Patent: Sep. 8, 2020

(54) PRINTED CIRCUIT BOARD COMPONENT COVER

(71) Applicant: Hewlett-Packard Development Company, L.P., Houston, TX (US)

(72) Inventors: Adolfo Gomez, Fort Collins, CO (US); Tom J. Searby, Eaton, CO (US); Andrew L. Wiltzius, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 212 days.

(21) Appl. No.: 15/543,206

(22) PCT Filed: Jan. 29, 2015

(86) PCT No.: PCT/US2015/013492
§ 371 (c)(1),
(2) Date: Jul. 12, 2017

(87) PCT Pub. No.: WO2016/122522
PCT Pub. Date: Aug. 4, 2016

(65) Prior Publication Data
US 2018/0279462 A1 Sep. 27, 2018

(51) Int. Cl.
*H05K 1/02* (2006.01)
*H05K 5/03* (2006.01)
(Continued)

(52) U.S. Cl.
CPC ............ *H05K 1/02* (2013.01); *B29C 51/002* (2013.01); *B29C 51/266* (2013.01); *B29C 65/48* (2013.01);
(Continued)

(58) Field of Classification Search
CPC .......... H05K 1/02; H05K 5/0239; H05K 5/03;
H05K 2201/10371; H05K 2201/10409;
B29C 51/002; B29C 51/266; B29C 65/48;
B29C 65/562; B29C 65/565; B29K
2069/00; B29L 2031/3425
(Continued)

(56) References Cited

U.S. PATENT DOCUMENTS 5,214,572 A * 5/1993 Cosimano ............... G06F 1/184
211/41.17
5,579,212 A 11/1996 Albano et al.
(Continued)

FOREIGN PATENT DOCUMENTS

JP 07-023173 A 1/1995
JP 08148842 A 6/1996
(Continued)

OTHER PUBLICATIONS

R.S. Khandpur; "Conformal Coatings"; < http://books.google.co.in/books?id=VY8iBAAAQBAJ&pg=PA361&lpg=PA361&dq=plastic+coating+over+circuit+board+components+prevent+damage&source=bl&ots=TAnuigQ_SK&sig=gF6D0Z6-yYyPqcJeBN1e2fSYKFo&hl=en&sa=X&ei=gyV4VNb9Fo2WuASI5oLoDA&ved=0CC4Q6AEwAzgK#v=onepage&q=plastic%20coating%20over%20circuit%20board%20components%20prevent%20damage&f=false.

*Primary Examiner* — Steven T Sawyer
(74) *Attorney, Agent, or Firm* — Fabian VanCott

(57) ABSTRACT

A system for protecting components on a printed circuit board (PCB) includes a polycarbonate sheet. The polycarbonate sheet is formed to match a gross contour of a number of components coupled to the PCB. The system further includes a number of a fasteners to couple the polycarbonate sheet to the PCB.

18 Claims, 7 Drawing Sheets

(51) Int. Cl.
*H05K 5/02* (2006.01)
*B29C 51/00* (2006.01)
*B29C 51/26* (2006.01)
*B29C 65/48* (2006.01)
*B29C 65/56* (2006.01)
*B29K 69/00* (2006.01)
*B29L 31/34* (2006.01)

(52) U.S. Cl.
CPC .......... *B29C 65/562* (2013.01); *B29C 65/565* (2013.01); *H05K 5/0239* (2013.01); *H05K 5/03* (2013.01); *B29K 2069/00* (2013.01); *B29L 2031/3425* (2013.01); *H05K 2201/10371* (2013.01); *H05K 2201/10409* (2013.01)

(58) Field of Classification Search
USPC ........................................................ 361/748
See application file for complete search history.

(56) References Cited

U.S. PATENT DOCUMENTS

| | | | |
|---|---|---|---|
| 5,756,937 A | 5/1998 | Gleadall | |
| 6,428,650 B1* | 8/2002 | Chung | B29C 66/1224 156/250 |
| 6,483,719 B1* | 11/2002 | Bachman | H05K 9/003 174/378 |
| 8,665,603 B2 | 3/2014 | Brieda et al. | |
| 2003/0076656 A1* | 4/2003 | Roy | H05K 7/20154 361/690 |
| 2003/0199195 A1* | 10/2003 | Koehler | H01R 12/724 439/541.5 |
| 2004/0218375 A1* | 11/2004 | Fronk | H05K 7/209 361/813 |
| 2004/0250457 A1* | 12/2004 | Strein | G09F 9/305 40/547 |
| 2005/0045358 A1* | 3/2005 | Arnold | H05K 9/0024 174/51 |
| 2008/0094802 A1* | 4/2008 | Kumagai | G06F 1/203 361/709 |
| 2008/0284003 A1 | 11/2008 | Kwang et al. | |
| 2014/0190000 A1 | 7/2014 | Stevens et al. | |
| 2014/0273641 A1 | 9/2014 | Light et al. | |
| 2015/0146375 A1* | 5/2015 | Lu | H05K 7/1432 361/695 |

FOREIGN PATENT DOCUMENTS

| | | |
|---|---|---|
| JP | 09167895 A | 6/1997 |
| KR | 10-0715437 B1 | 5/2007 |
| KR | 10-2014-0096735 A | 8/2014 |

* cited by examiner

PRINTED CIRCUIT BOARD COMPONENT COVER

BACKGROUND

Computing devices have become ubiquitous within society. Users of computing devices such as desktop computing devices, laptop computing devices, and server computing devices are often knowledgeable and comfortable enough accessing various components within their respective computing devices. A user may access these components in order add or update components within the computing device.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
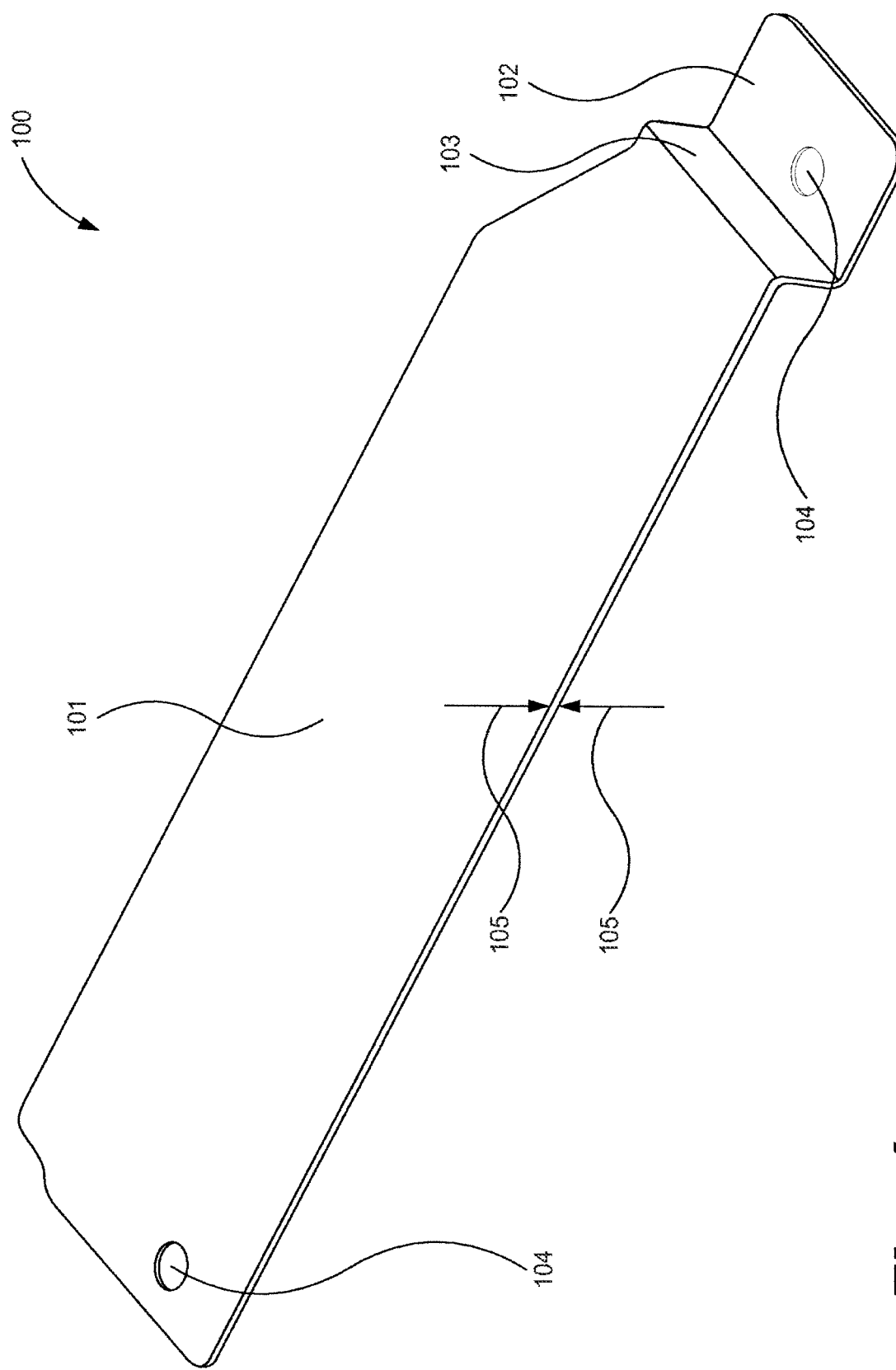
FIG. 1 is a diagram of a printed circuit board (PCB) component cover for protecting a PCB and a number of components attached to the PCB from physical and electrical damage, according to one example of the principles described herein.

Several components within a computing device are susceptible to physical and electrical damage through contact by the user or devices and components in the user's control. This may occur, for example, when a user is installing or removing an add-in card also known as an expansion card. Add-in cards may include, for example, graphics cards and local area network (LAN) communications cards. Data obtained indicates that approximately 33% of all system board failures are caused by components being electrically shorted through physical contact with a conductive surface. In most of these cases of system board failure, the bulkhead of an add-in card may come in contact with one or more components on the system board. This may occur when the overall computing system has not yet been properly powered down or one or more of the components are still powered or include a stored charge that has not been discharged. Electrical damage can occur when the add-in card bulkhead makes physical contact with an electrically powered component on the system board. This may result in an electrical short and permanent damage to the system board and one or more of its components.

Mechanical damage results when the add-in card bulkhead, the user's body, or a tool makes excessive physical contact with components on the system board. When this occurs, components on the system board may physically break off the system board.

Examples described herein provide a printed circuit board (PCB) component cover. In one example, the PCB is a motherboard of a computing device. The PCB component cover includes an amount of non-conductive material. The non-conductive material is formed to define a number of gross contours of a number of components on the PCB, In one example, a number of perforations may be defined within the non-conductive material to provide for cooling of components on the PCB during operation of the computing device.

In one example, the PCB component cover (100) is made of a non-conductive material. In one example, the non-conductive material is a polymer. In another example, the polymer material is a polycarbonate material. In still another example, the PCB component cover (100) is made of a conductive substrate such as aluminum or steel coated with a non-conductive material such as a polymer.

The thickness of the PCB component cover (100) is sufficient to protect components on the PCB from electrical and mechanical damage. In one example, the PCB component cover (100) is between 0.2 mm and 1.0 mm thick. The plastic may be a polycarbonate sheet. In one example, the polycarbonate sheet is a clear polycarbonate sheet.

A fastener is used to fasten the PCB component cover to the PCB. In one example, the PCB component cover is coupled to the PCB via a number of existing stand-off screws used to secure the PCB to a housing. In another example, the PCB component cover is coupled to the PCB via an adhesive. In another example, the PCB component cover can be formed in such a way that no auxiliary retention method is required to secure to the PCB.

As used in the present specification and in the appended claims, the term "gross contour" is meant to be understood broadly as a number of planes that are parallel to a height of a plurality of elements. Thus, in the context of a printed circuit board (PCB) including a number of components attached thereto, a gross contour includes a number of planes parallel to the height of a plurality of the components. In one example, the gross contour may be parallel to an average height of a plurality of the elements. In another example, the gross contour may be parallel to a maximum height of a plurality of the elements. In still another example, the gross contour may be parallel to a minimum height of a plurality of the elements.

Even still further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Figure 3:
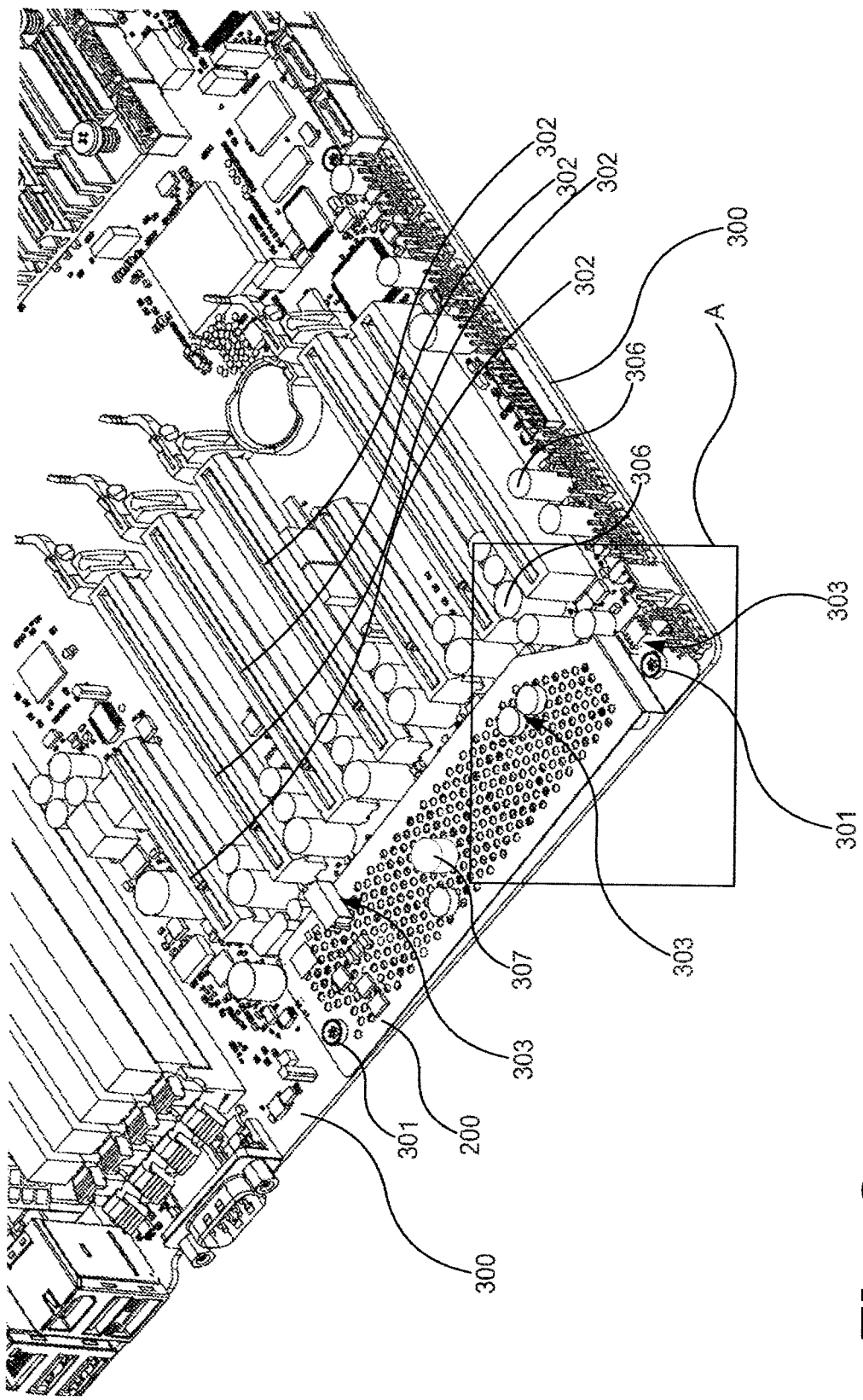
FIG. 3 and FIG. 3A are diagrams of a PCB component cover, such as that of FIG. 2, attached to a PCB, according to two examples of the principles described herein.

FIG. 1 is a diagram of a printed circuit board (PCB) component cover (100) for protecting a printed circuit board (PCB) and a number of components attached to the PCB from physical and electrical damage, according to one example of the principles described herein. The PCB component cover (100) comprises a number of horizontal planes (101, 102) that run parallel to a number of planes defined by the height of a plurality of the components. Horizontal plane (101) may be used to cover a plurality of the components. In one example, horizontal plane (101) may include a number of mounting holes (104) defined therein (104). In this example, the mounting holes (104) may be used in conjunction with either provided or existing motherboard stand-off screws (FIG. 3, 301) in order to couple the PCB component cover (100) to a PCB (FIG. 3, 300). Although the PCB component cover (100) of FIG. 1 includes a number of horizontal and vertical planes, the surface of the PCB component cover (100) may include any number of surfaces that run at any angle. In one example, a number of corrugated surfaces may be formed in the surface of the PCB component cover (100).

Horizontal plane (102) may be used to couple the PCB component cover (100) to a printed circuit board in a similar manner as described in connection with horizontal plane (101). Horizontal plane (102) may also include a number of mounting holes (104) used in conjunction with either provided or existing motherboard stand-off screws (FIG. 3, 301) in order to couple the PCB component cover (100) to a PCB (FIG. 3, 300). In the case of horizontal plane (102), a bottom surface may come in direct contact with the PCB (FIG. 3, 300). In contrast, and in one example, the bottom surface of horizontal plane (101) may be offset from a top surface of the PCB (FIG. 3, 300) via the motherboard stand-off screws (FIG. 3, 301) used to couple that plane to the PCB (FIG. 3, 300).

In another example, an adhesive may be used to couple the PCB component cover (100) to a PCB (FIG. 3, 300). In this example, the adhesive is applied to the bottom surface of a number of the horizontal planes (101, 102) to attach those horizontal planes (101, 102) to the PCB (FIG. 3, 300). In one example, the adhesive is a non-conductive adhesive.

In still another example, the PCB component cover (100) may be coupled to the PCB (FIG. 3, 300) without additional fasteners or adhesives. In one example, existing stand-off screws may be used to couple the PCB component cover (100) to the PCB (FIG. 3, 300). In this example, the PCB (FIG. 3, 300) includes stand-of screws (FIG. 3, 301) that are used to couple the PCB (FIG. 3, 300) to a housing of a computing system or other structural components. Further, in this example, the PCB component cover (100) may be designed to fit a specific PCB (FIG. 3, 300) layout with a number of features such as holes for the standoff screws being defined in the PCB component cover (100).

Figure 3A:
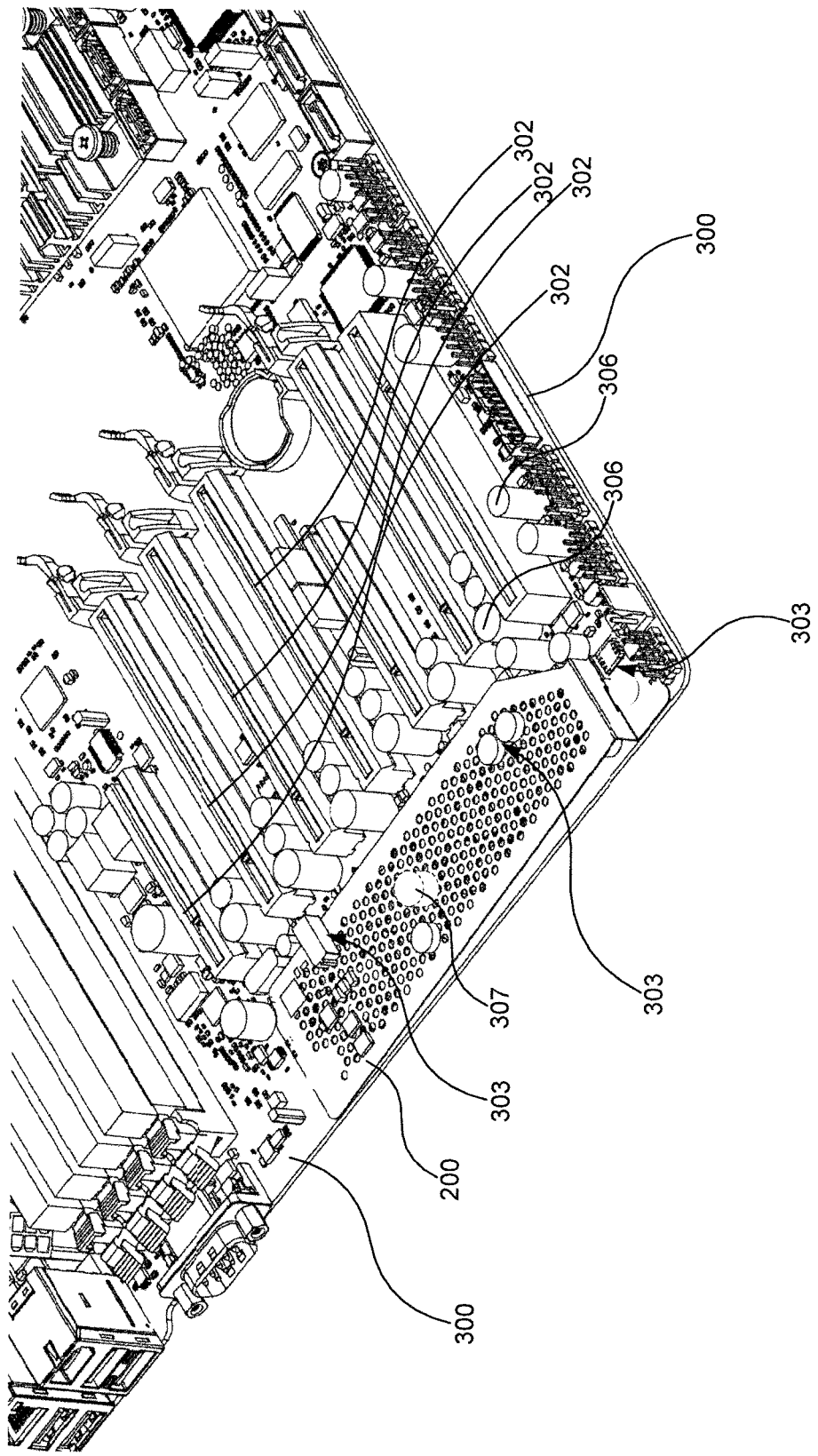

In another example where the PCB component cover (100) may be coupled to the PCB (FIG. 3, 300) without additional fasteners or adhesives, the PCB component cover (100) may be formed to create an interference fit among a number of features and components of the PCB (FIG. 3A, 300). In this example, the PCB component cover (100) utilizes the position of features and components of the PCB (FIG. 3, 300) to create a tensioning fit of the PCB component cover (100) such that the PCB component cover (100), when installed, is coupled to the PCB (FIG. 3, 300) via the features and components of the PCB (FIG. 3, 300). In another example, the PCB component cover (100) may be coupled to the PCB (FIG. 3, 300) using a combination of the coupling devices and methods described herein.

In one example, the PCB component cover (100) is made of a non-conductive material. In this manner, the non-conductive material of the PCB component cover (100) serves as a barrier between components coupled to the PCB (FIG. 3, 300) and an add-in card bulkhead, the user's body, a tool or other object that may cause physical or electrical damage to the components. In one example, the non-conductive material is a polymer. In another example, the non-conductive material is a polycarbonate material.

In another example, the PCB component cover (100) is made of a polycarbonate (PC) material. Polycarbonate materials are inexpensive in both cost of materials and in the manufacturing of the material in the PCB component cover (100). Further, polycarbonate materials are resistant to ultraviolet radiation. Still further, polycarbonate materials are resistant to heat ranges experienced within a computing environment and fluctuations in heat found therein. In other examples, the PCB component cover (100) may be made of biaxially-oriented polyethylene terephthalate (boPET) such as MYLAR produced and distributed by E. I. du Pont de Nemours and Company, polyethylene terephthalate (PET), or other forms of non-conductive materials. Other non-conductive materials from which the PCB component cover (100) may be made of include papers or cardboard.

In one example, the PCB component cover (100) is made of a translucent or transparent material such as, for example, a translucent or transparent polycarbonate. In another example, the PCB component cover (100) is made of an opaque material such as, for example, an opaque polycarbonate.

The thickness of the PCB component cover (100) as indicated by arrows 105 may be between 0.2 mm and 1.0 mm. In another example, the thickness (105) of the PCB component cover (100) may be between 0.5 and 0.7 mm. However, the thickness (105) of the PCB component cover may be lesser or greater than this range depending on the application. For example, a PCB component cover (100) that is designed to cover a large area of a PCB may be made thicker to provide rigidity to the PCB component cover (100) over the relatively longer distances. Further, a PCB component cover (100) that is designed to cover a relatively smaller area of a PCB may be made thinner to require less cost in materials and to allow for improved cooling of components coupled to the PCB.

The PCB component cover (100) may further comprise a number of vertical transitions planes (103). The vertical transition planes (103) allow for the first horizontal plane (101) and the second horizontal plane (102) to be separated vertically. Any number of vertical transitions planes (103) may be included within the PCB component cover (100) to provide any number of horizontal planes (101, 102). In this manner, the PCB component cover (100) may follow a gross contour of a number of components coupled to the PCB (FIG. 3, 300), groups of components coupled to the PCB (FIG. 3, 300), a number of layers of PCBs, or combinations thereof in order to protect those elements from physical and electrical damage.

Figure 2:
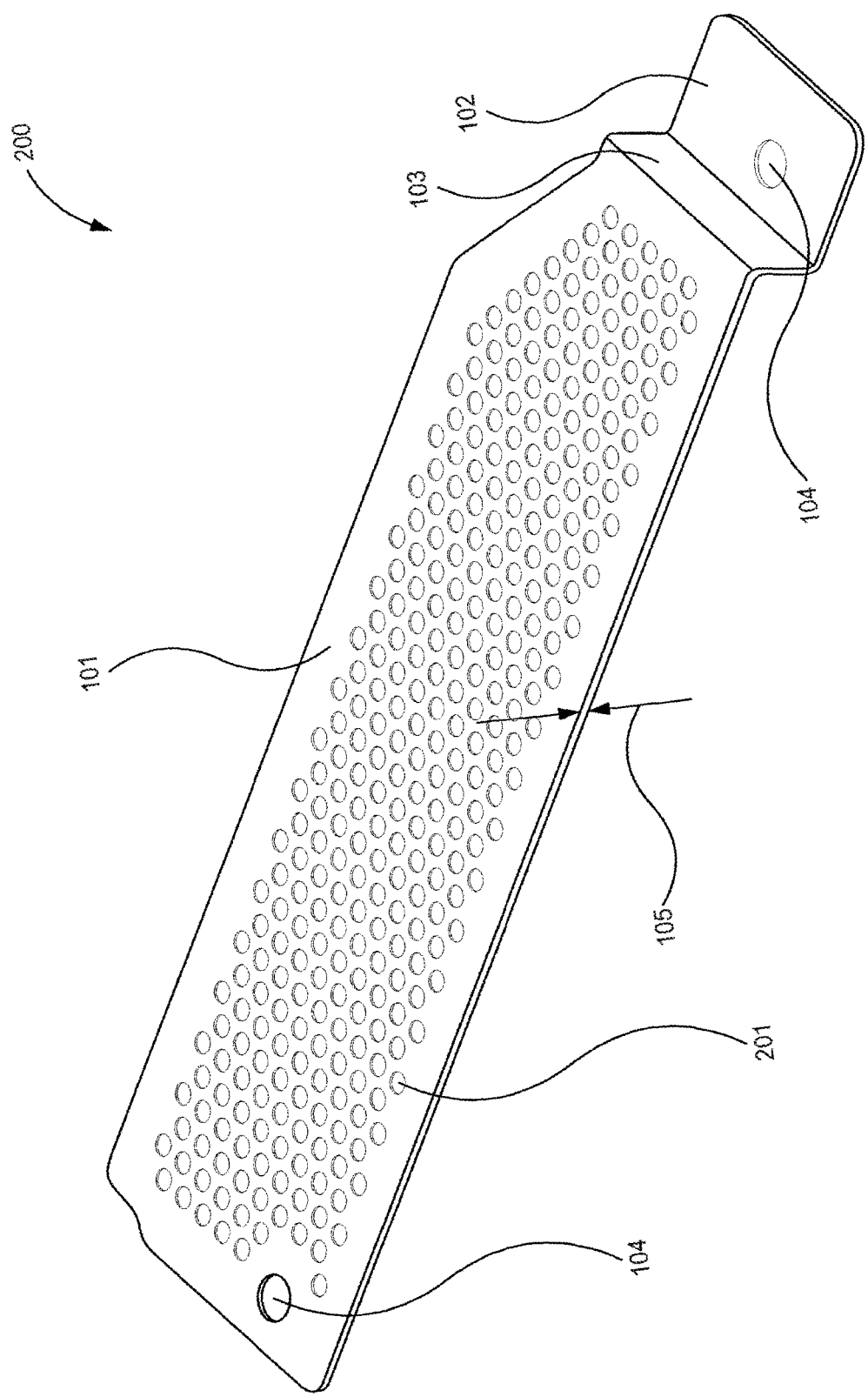
FIG. 2 is a diagram of a PCB component cover for protecting a PCB and a number of components attached to the PCB from physical and electrical damage, according to another example of the principles described herein.

FIG. 2 is a diagram of a PCB component cover (200) for protecting a PCB and a number of components attached to the PCB from physical and electrical damage, according to another example of the principles described herein. Similar elements within FIG. 2 as compared to FIG. 1 include similar properties and have similar advantages. As depicted in FIG. 2, the PCB component cover (200) has a number of perforations (201) defined therein. The perforations (201) assist in the cooling of components coupled to the PCB (FIG. 3, 300) by allowing air to penetrate the PCB component cover (200) through the perforations (201) and cool the components. In one example, the perforations (201) may be defined within the PCB component cover (200) in a pattern as depicted in FIG. 2. In another example, the perforations (201) may be defined within the PCB component cover (200) such that the perforations (201) are placed above or in the same area as a number of components on the PCB (FIG. 3, 300) that experience relatively higher heat outputs and require relatively more cooling. Thus, the example of FIG. 2 provides for cooling of the components coupled to the PCB (FIG. 3, 300).

In the examples described herein, a number of component apertures (FIG. 3, 303) may be defined within the PCB component cover (100, 200) to allow for a number of components to enter into the component apertures (FIG. 3, 303) and penetrate one or more horizontal planes (101, 102) of the PCB component cover (100, 200). In this example, the gross contour of the PCB component cover (100, 200) is still followed by the horizontal planes (101, 102), but a number of components are allowed to exceed the surfaces of the horizontal planes (101, 102). This may simplify the installation of the PCB component cover (100, 200) within a computing system. Further, this may also provide a more snug fit of the PCB component cover (100, 200) relative to a number of features of and components coupled to the PCB (100) as described above.

In another example, the PCB component cover (100, 200) may be embossed to allow a number of components to enter into the embossed portions and reside therein. In this manner, a number of the horizontal planes (101, 102) are not completely flat, but take on a more conforming fit that includes the shape of a number of the components.

Figure 4:
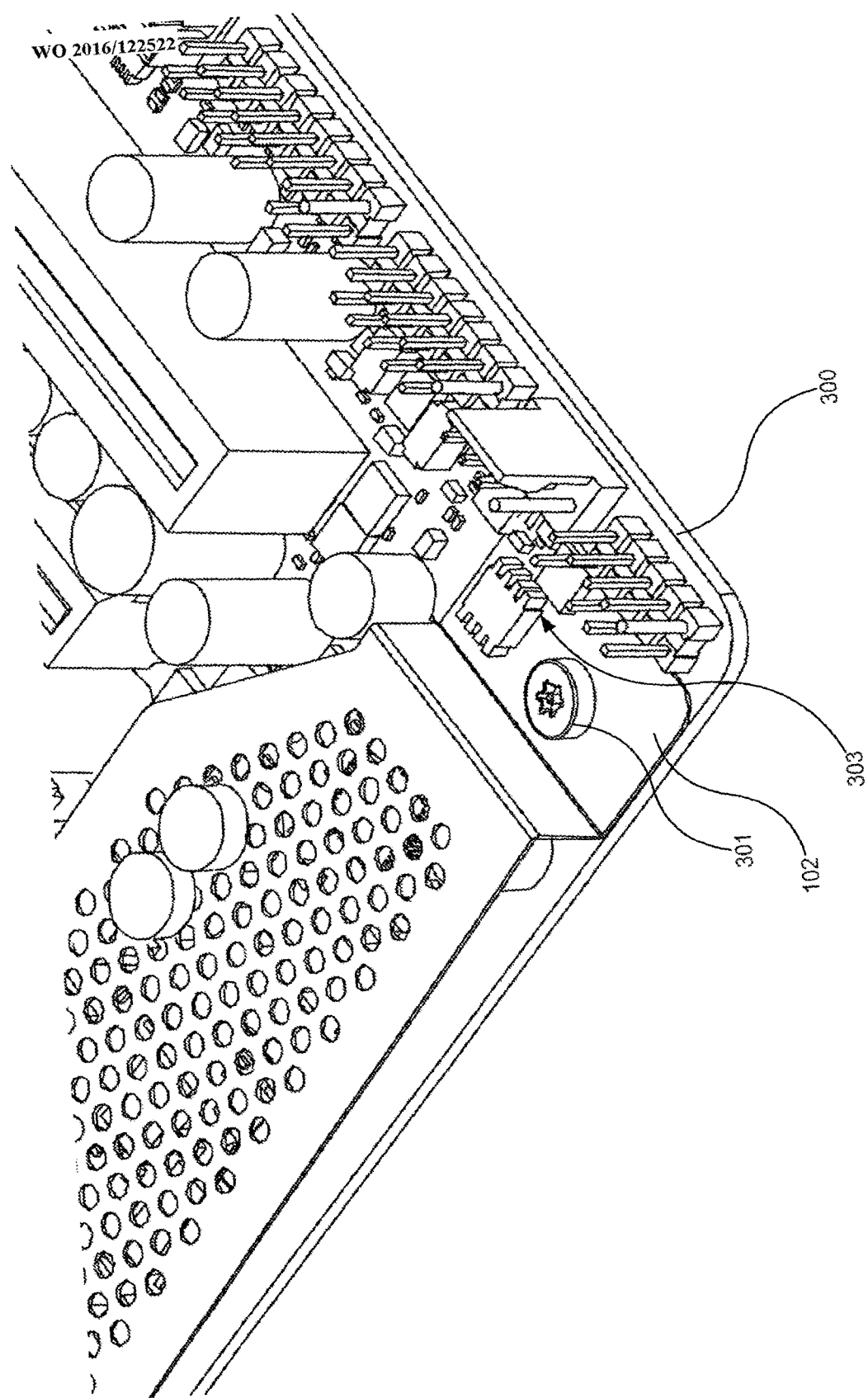
FIG. 4 is a close-up view of the diagram of FIG. 3 as defined by box A of FIG. 3, according to one example of the principles described herein.

FIG. 3 is a diagram of a PCB component cover (200) of FIG. 2 attached to a PCB (300), according to one example of the principles described herein. FIG. 4 is a close-up view of the diagram of FIG. 3 as defined by box A of FIG. 3, according to one example of the principles described herein. Although the example of FIG. 2 is included within FIG. 3, the example of FIG. 1 or other examples described herein may be applied in a similar manner.

As depicted in FIG. 3, a number of expansion card slots (302) are present on the PCB (300) next to a number of components. The components may include exposed components (306) or components (307) covered by the PCB component cover (200), As described above, electrical and mechanical damage may occur to the components (306, 307) if, for example, a bulkhead of an add-in card comes in contact with one or more components (306, 307) on the PCB (300) when the overall computing system has not yet been properly powered down or one or more of the components (306, 307) are still powered or include a stored charge that has not been discharged. The PCB component covers (100, 200) described herein reduce or eliminate electrical or mechanical damage to the components (306, 307) by providing a barrier between these foreign objects and the components (306, 307). The examples described herein provide such protection when, for example, a user seeks to install add-in cards into the expansion card slots (302), or perform other actions associated with one or more components on the PCB (300).

As depicted in FIG. 4, a number of component apertures (FIG. 3, 303) may be defined within the PCB component cover (100, 200) to allow for a number of components to enter into the component apertures (FIG. 3, 303) and penetrate one or more horizontal planes (101, 102) of the PCB component cover (100, 200). The example, depicted in FIG. 4, includes such a component aperture (303) in horizontal plane (102) that is coupled to the PCB (300). Thus, in this example, even horizontal planes that come into direct contact with the PCB (300) may have component apertures (303) defined therein.

Figure 5:
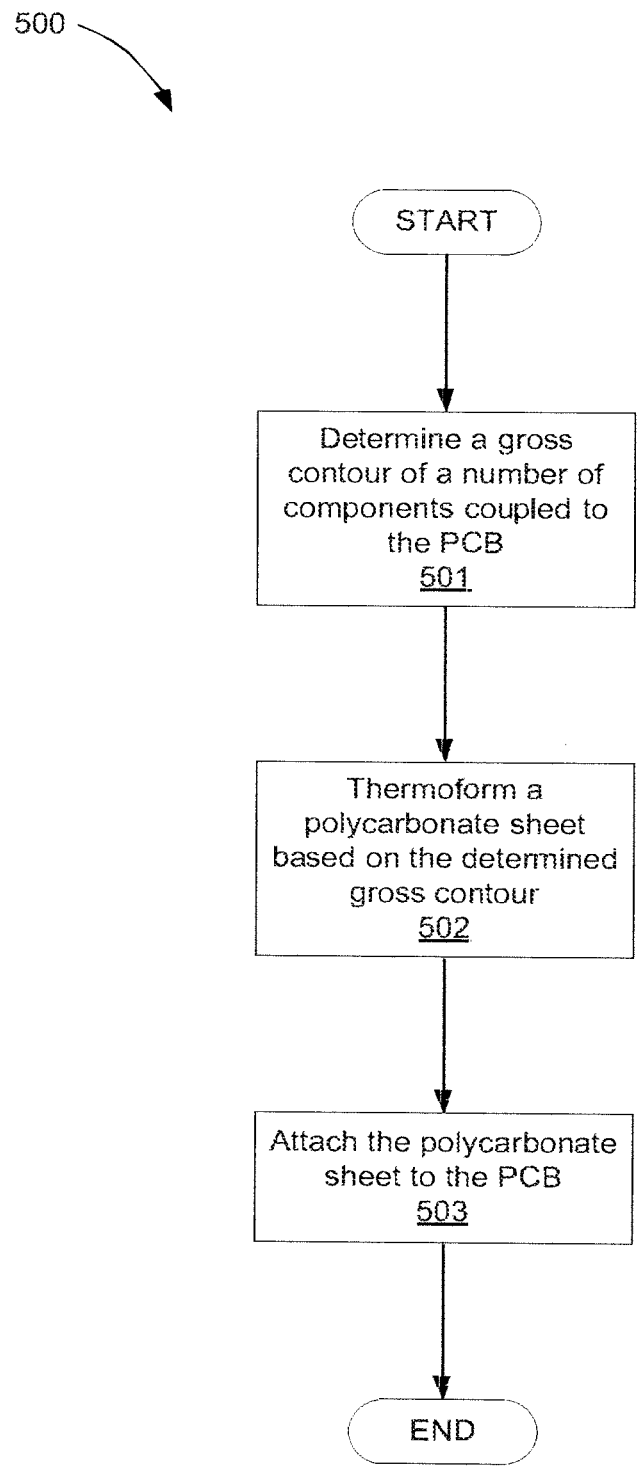
FIG. 5 is a flowchart showing a method of protecting a PCB, according to one example of the principles described herein.

FIG. 5 is a flowchart (500) showing a method of protecting a PCB (FIG. 3, 300), according to one example of the principles described herein. The method of FIG. 5 may begin by determining (block 501) a gross contour of a number of components coupled to the PCB (FIG. 3, 300). Measurements may be taken as to the height of a number of the components coupled to the PCB (FIG. 3, 300). These measurements may be performed using 3D laser scanning devices or other size measurement devices to determine the height of the components relative to the top of the PCB (FIG. 3, 300).

A polycarbonate sheet may be thermoformed (block 502) based on the gross contour determined at block 501. Thermoforming may be achieved using die-cutting processes, vacuum molding processes, injection molding processes, blow molding processes, rotational molding processes, other thermoforming processes, or combinations thereof. In one example, a number of perforations (201) may also be formed in the polycarbonate sheet. The formed polycarbonate sheet is attached (block 503) to the PCB (FIG. 3, 300) to protect a number of the components coupled thereto.

Figure 6:
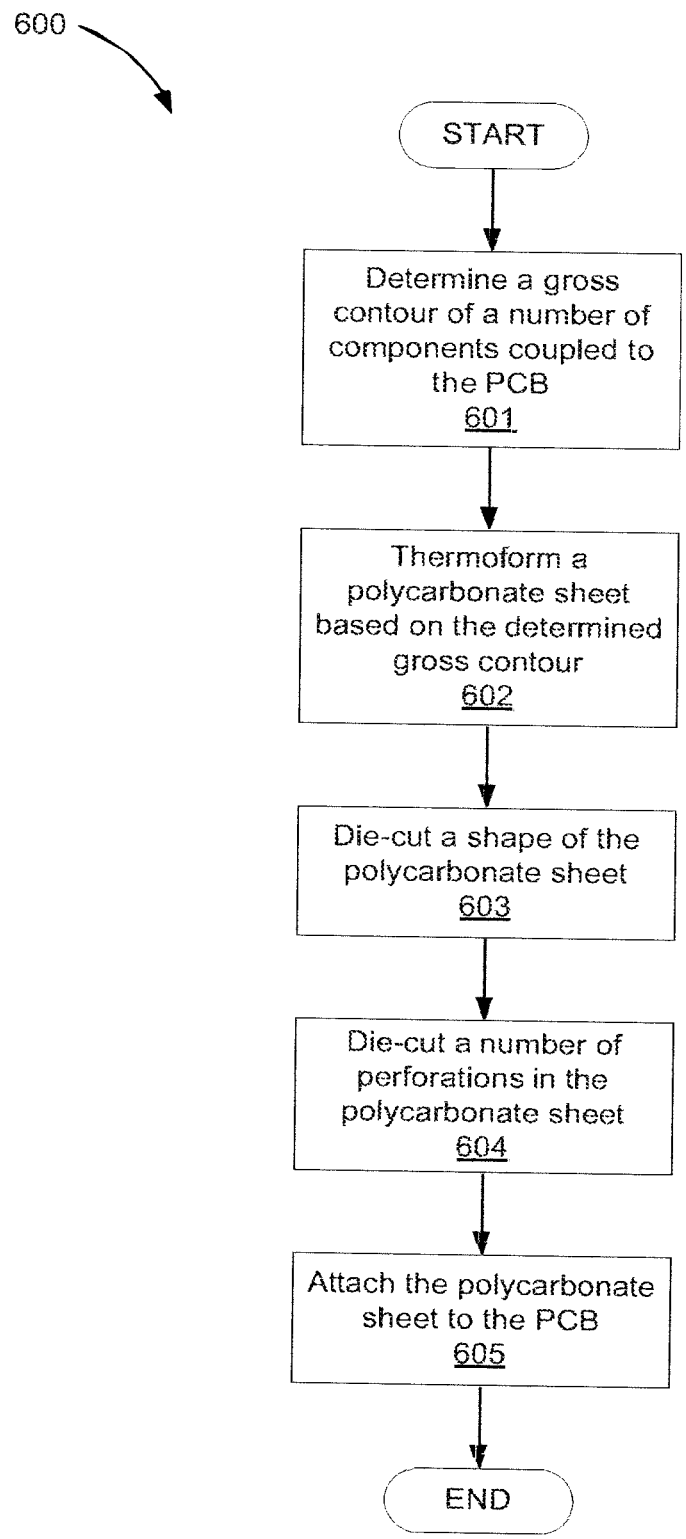
FIG. 6 is a flowchart showing a method of protecting a PCB, according to another example of the principles described herein.

FIG. 6 is a flowchart showing a method (600) of protecting a PCB, according to another example of the principles described herein. The method (600) of FIG. 6 may begin by determining (block 601) a gross contour of a number of components coupled to the PCB (FIG. 3, 300). The polycarbonate sheet may be thermoformed (block 602) based on the gross contour determined at block 601.

The shape of the polycarbonate sheet is then die-cut (block 603). In one example, the shape of the polycarbonate sheet is based on the area of the PCB (FIG. 3, 300) over which the polycarbonate sheet is to cover. A number of perforations (FIG. 2, 201) are also die-cut (604) into the polycarbonate sheet. The formed polycarbonate sheet is attached (block 605) to the PCB (FIG. 3, 300) to protect a number of the components coupled thereto.

The specification and figures describe a printed circuit board (PCB) component cover. The PCB component cover includes an amount of non-conductive material. The non-conductive material is formed to define a number of gross contours of a number of components on the PCB. The PCB component cover may also include a fastener to fasten the PCB component cover to the PCB. This PCB component cover may have a number of advantages, including: (1) providing protection to components on a PCB from electrical damage caused by shorting; (2) providing protection to components on a PCB from physical damage such as scraping and impact damage; (3) provides protection to components on a PCB in a low-cost and effective manner.

The preceding description has been presented to illustrate and describe examples of the principles described. This description is not intended to be exhaustive or to limit these principles to any precise form disclosed. Many modifications and variations are possible in light of the above teaching.

What is claimed is:
1. A printed circuit board (PCB) component cover to protectively cover components on a printed circuit board (PCB), the cover comprising:
    an amount of non-conductive material, the non-conductive material formed to define a number of gross contours accommodating a number of components on the PCB, the non-conductive material comprising a number of apertures through each of which a respective component on the PCB extends when the cover is in place on the PCB, the non-conductive material additionally comprising a number of perforations, wherein the number and size of the perforations provide for cooling of components coupled to the PCB and covered by the PCB component cover, at least one of the apertures being completely surrounded by perforations of the number of perforations.

2. The PCB component cover of claim 1, wherein the non-conductive material is between 0.2 mm and 0.3 mm thick.

3. The PCB component cover of claim 1, wherein the non-conductive material is a polycarbonate sheet.

4. The PCB component cover of claim 3, wherein the polycarbonate sheet is a clear polycarbonate sheet.

5. The PCB component cover of claim 1, wherein the PCB is a motherboard of a computing device.

6. The PCB component cover of claim 1, wherein the PCB component cover is coupled to the PCB via a number of existing stand-off screws used to secure the PCB to a housing.

7. The PCB component cover of claim 1, wherein the PCB component cover is coupled to the PCB via an adhesive.

8. A system for protecting components on a printed circuit board (PCB) comprising:
- a number of slots for connecting add-in cards to the PCB;
- a number of electronic components on the PCB adjacent to the number of slots;
- a polycarbonate sheet, the polycarbonate sheet being formed to match a gross contour of the number of components coupled to the PCB adjacent to the number of slots; and
- a number of fasteners to couple the polycarbonate sheet to the PCB as a cover over the number of components having a gross contour matched to the polycarbonate sheet;
- wherein the polycarbonate sheet further comprises:
  - a field of perforations to facilitate cooling of components on the PCB, the perforations arranged in a regular pattern over a surface of the polycarbonate sheet and
  - a number of apertures through each of which a respective component on the PCB extends when the cover is in place on the PCB.

9. A method of protecting a printed circuit board (PCB), comprising:
- determining a gross contour of a number of components coupled to the PCB;
- thermoforming a polycarbonate sheet based on the determined gross contour; and
- attaching the polycarbonate sheet to the PCB via an interference fit between the polycarbonate sheet and the components coupled to the PCB
- wherein attaching the polycarbonate sheet to the PCB comprises:
- die-cutting a number of holes in the polycarbonate sheet in positions where a corresponding number of PCB standoff screws are located on the PCB, the correspondence being based on a position the polycarbonate sheet is to be placed on the PCB;
- removing the PCB standoff screws from the PCB; and
- attaching the polycarbonate sheet to the PCB using the removed PCB standoff screws.

10. The method of claim 9, further comprising die cutting a number of perforations in the polycarbonate sheet.

11. The method of claim 9, wherein thermoforming a polycarbonate sheet based on the determined gross contour comprises thermoforming the polycarbonate sheet using vacuum molding, injection molding, blow molding, rotational molding, or combinations thereof.

12. The method of claim 9, wherein attaching the polycarbonate sheet to the PCB comprises attaching the polycarbonate sheet to the PCB using an adhesive.

13. The PCB component cover of claim 1, wherein the cover is sloped relative to the protected PCB board.

14. The PCB component cover of claim 13, further comprising a step.

15. The system of claim 8, wherein the polycarbonate sheet comprises a step.

16. A system for protecting components on a printed circuit board (PCB) comprising:
- a polycarbonate sheet, the polycarbonate sheet being formed to match a gross contour of a number of components coupled to the PCB; and
- wherein the polycarbonate sheet attaches via interference fit at a slope relative to the PCB; and
- wherein the polycarbonate sheet further comprises:
- a field of perforations to facilitate cooling of components on the PCB, the perforations arranged in a regular pattern over a surface of the polycarbonate sheet;
- a number of apertures through each of which a respective component on the PCB extends when the polycarbonate sheet is in place as a cover on the PCB.

17. The system of claim 8, wherein at least one of the apertures is completely surrounded by the field of perforations.

18. The system of claim 8, wherein the number of fasteners are points of interference fit between the sheet and components of the PCB.

* * * * *